United States Patent
Uchida

(10) Patent No.: US 9,178,402 B2
(45) Date of Patent: Nov. 3, 2015

(54) CONTROL UNIT FOR ELECTRIC MOTOR AND VEHICLE STEERING SYSTEM INCLUDING THE SAME

(71) Applicant: JTEKT CORPORATION, Osaka-shi, Osaka (JP)

(72) Inventor: Nobuhiro Uchida, Yamatotakada (JP)

(73) Assignee: JTEKT CORPORATION, Osaka-shi (JP)

( * ) Notice: Subject to any disclaimer, the term of this patent is extended or adjusted under 35 U.S.C. 154(b) by 353 days.

(21) Appl. No.: 13/771,837

(22) Filed: Feb. 20, 2013

(65) Prior Publication Data
US 2013/0221811 A1 Aug. 29, 2013

(30) Foreign Application Priority Data
Feb. 28, 2012 (JP) ................................. 2012-041868

(51) Int. Cl.
*B62D 5/04* (2006.01)
*H02K 11/00* (2006.01)
*H05K 1/02* (2006.01)
*H05K 5/00* (2006.01)
*H05K 3/00* (2006.01)

(52) U.S. Cl.
CPC .......... *H02K 11/0073* (2013.01); *B62D 5/0406* (2013.01); *H05K 1/0203* (2013.01); *H05K 5/0043* (2013.01); *H05K 1/0298* (2013.01); *H05K 3/0061* (2013.01); *H05K 2201/0999* (2013.01); *H05K 2201/09972* (2013.01)

(58) Field of Classification Search
USPC ....................................................... 310/68 R
See application file for complete search history.

(56) References Cited

U.S. PATENT DOCUMENTS

| | | | | |
|---|---|---|---|---|
| 6,548,972 | B2 * | 4/2003 | Takagi | 318/293 |
| 7,021,418 | B2 * | 4/2006 | Tominaga et al. | 180/444 |
| 7,621,367 | B2 * | 11/2009 | Tominaga et al. | 180/444 |
| 7,635,046 | B2 * | 12/2009 | Tominaga et al. | 180/444 |
| 8,002,076 | B2 * | 8/2011 | Yoshinari et al. | 180/444 |
| 8,520,394 | B2 * | 8/2013 | Wakita | 361/720 |
| 2003/0173920 | A1 * | 9/2003 | Tominaga et al. | 318/432 |
| 2008/0144290 | A1 | 6/2008 | Brandt et al. | |
| 2010/0231038 | A1 | 9/2010 | Sugimura et al. | |
| 2013/0300264 | A1 * | 11/2013 | Fujimoto | 310/68 D |

FOREIGN PATENT DOCUMENTS

| | | |
|---|---|---|
| EP | 0 827 373 A1 | 3/1998 |
| JP | A-2009-277726 | 11/2009 |
| JP | A-2011-083063 | 4/2011 |

OTHER PUBLICATIONS

European Search Report issued in Application No. 13156126.8; Dated Jun. 14, 2013.

* cited by examiner

*Primary Examiner* — Burton Mullins
(74) *Attorney, Agent, or Firm* — Oliff PLC

(57) ABSTRACT

In a circuit board, a control pattern portion in which control circuit patterns are formed and a drive pattern portion in which drive circuit patterns are formed are formed in different regions. A recessed portion is formed in a base, and the drive pattern portion is fixed to the base such that insulation between a drive circuit and the base is maintained and the control pattern portion is arranged above the recessed portion. In this way, a space in which a circuit element is able to be mounted is formed between the control pattern portion and the recessed portion.

2 Claims, 5 Drawing Sheets

CONTROL UNIT FOR ELECTRIC MOTOR AND VEHICLE STEERING SYSTEM INCLUDING THE SAME

INCORPORATION BY REFERENCE/RELATED APPLICATION

This application claims priority to Japanese Patent Application No. 2012-041868 filed on Feb. 28, 2012 the disclosure of which, including the specification, drawings and abstract, is incorporated herein by reference in its entirety.

BACKGROUND OF THE INVENTION

1. Field of the Invention

The invention relates to a control unit for an electric motor, and a vehicle steering system including the same.

2. Discussion of Background

Conventionally, a control unit for an electric motor used in, for example, a vehicle steering system includes a circuit board having a control circuit that outputs control signals and a drive circuit that turns on/off switching elements such as FETs based on the control signals to control a supply of drive currents to the electric motor. In recent years, in order to obtain a more compact and higher-density circuit, a circuit board having a multilayer structure has been employed. In the multilayer structure, multiple circuit conductive layers having circuit patterns are laminated with non-conductive layers interposed therebetween.

As such a control unit for an electric motor, Japanese Patent Application Publication No. 2011-83063 (JP 2011-83063 A) describes a control unit in which a control circuit and a drive circuit are formed on a single circuit board. On this circuit board, a control pattern portion in which control circuit patterns that constitute wirings of the control circuit is formed and a drive pattern portion in which drive circuit patterns that constitute wirings of the drive circuit is formed are arranged in different regions. In terms of size reduction, this control unit has an advantage over a control unit having a configuration in which a control circuit and a drive circuit are formed on different circuit boards and the circuit boards are connected by, for example, a bus bar as described in Japanese Patent Application Publication No. 2009-277726 (JP 2009-277726 A).

Because large drive currents that are supplied to an electric motor flow in a drive circuit, an amount of heat generation tends to be large, which may cause overheating of the drive circuit. Therefore, in the control unit described in JP 2011-83063 A, the circuit board is fixed to a base via a heat transfer sheet and heat generated in the drive circuit is released by causing the base to function as a heat sink. In this way, overheating of the drive circuit is prevented.

Recently, there has been a demand for a more compact control unit. However, in the configuration described in JP 2011-83063 A, the entirety of a side face (rear face) of the circuit board, the side face being on the housing side, is in contact with a housing via the heat transfer sheet. Therefore, circuit elements are provided only on one side of the circuit board. Accordingly, from a viewpoint of securing a mounting area for the circuit element, there is a limit on size reduction of the circuit board, and size reduction of the control unit has been extremely difficult.

SUMMARY OF THE INVENTION

The invention provides a more compact control unit for an electric motor and a vehicle steering system including the same.

According to a feature of an example of the invention, in a control unit for an electric motor, including a circuit board having a multilayer structure in which multiple circuit conductive layers having circuit patterns are laminated with non-conductive layers interposed between the circuit conductive layers, and a base to which the circuit board is fixed, the circuit board has a control pattern portion in which control circuit patterns constituting wirings of a control circuit that outputs a control signal are formed and a drive pattern portion in which drive circuit patterns constituting wirings of a drive circuit that supplies a drive current to the electric motor based on the control signal are formed, the control pattern portion and the drive pattern portion being formed in different regions; a recessed portion is formed in the base; and the drive pattern portion of the circuit board is fixed to the base such that insulation between the drive circuit and the base is maintained and the control pattern portion is arranged above the recessed portion; and a space in which a circuit element is able to be mounted is formed between the control pattern portion and the recessed portion.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

Hereinafter, embodiments of the invention will be described with reference to the accompanying drawings.

Figure 1:
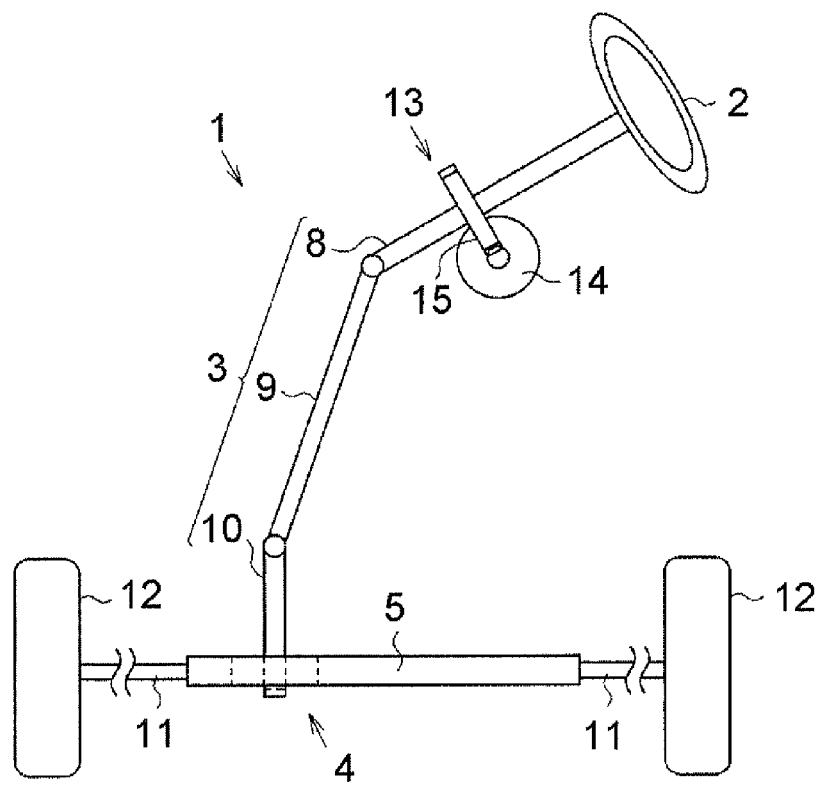
FIG. 1 is a view showing the schematic configuration of a vehicle steering system.

As shown in FIG. 1, in a vehicle steering system 1, a steering shaft 3 to which a steering wheel 2 is fixed is connected to a rack shaft 5 via a rack and pinion mechanism 4. With this configuration, rotation of the steering shaft 3 generated in response to a steering operation is converted into a linear motion of the rack shaft 5 by the rack and pinion mechanism 4. The steering shaft 3 is formed by connecting a column shaft 8, an intermediate shaft 9, and a pinion shaft 10 to each other. The linear motion of the rack shaft 5 generated in accordance with the rotation of the steering shaft 3 is transmitted to knuckles (not shown) via tie rods 11 connected to respective ends of the rack shaft 5. As a result, the steering angle of steered wheels 12, that is, the traveling direction of a vehicle is changed.

Further, the vehicle steering system 1 includes an EPS actuator (steering effort assisting device) 13 that supplies a steering system with an assist force for assisting a steering operation. The vehicle steering system 1 according to the present embodiment is configured as a so-called column-type electric power steering device in which the column shaft 8 is rotated. In the vehicle steering system 1, an electric motor 14 that serves as a driving source for the EPS actuator 13 is connected to the column shaft 8 via a speed reduction mechanism 15 that includes a worm gear and a worm wheel so as to drive the column shaft 8. The speed of rotation transmitted from the electric motor 14 is reduced by the speed reduction mechanism 15 and the rotation with a reduced speed is transmitted to the column shaft 8. In this way, motor torque is supplied to the steering system as the assist force.

Figure 2:
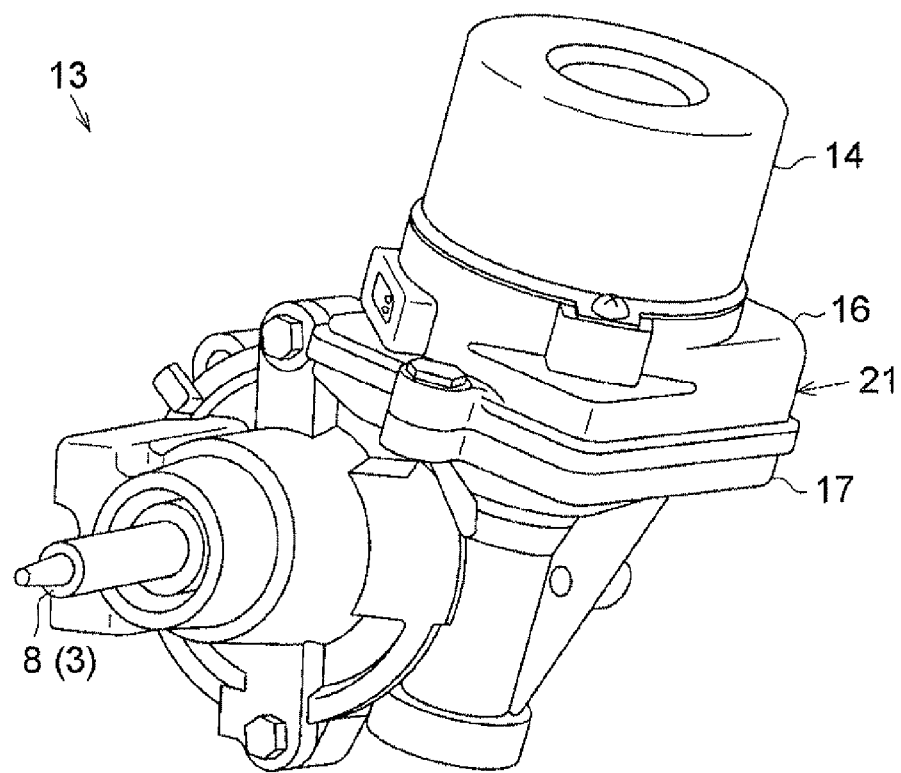
FIG. 2 is a perspective view of an EPS actuator.
Figure 3:
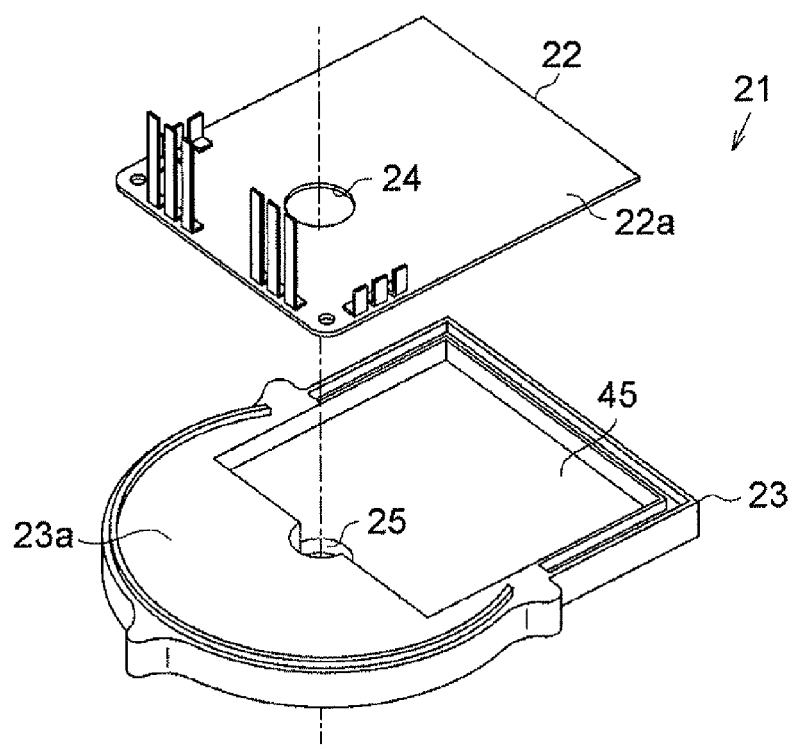
FIG. 3 is an exploded perspective view of a control unit.
Figure 4:
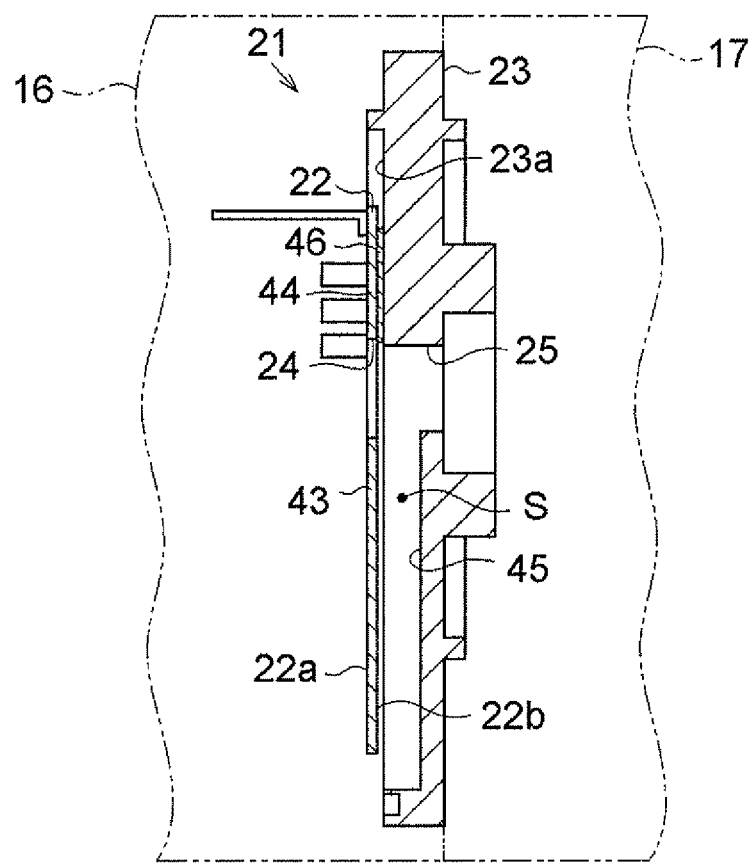
FIG. 4 is a sectional view of the control unit.

As shown in FIG. 2, in the EPS actuator 13, a control unit 21 that controls an operation of the electric motor 14 is provided between a first housing 16 to which the electric motor 14 is fixed and a second housing 17 that accommodates the speed reduction mechanism 15. As shown in FIG. 3 and FIG. 4, the control unit 21 includes a circuit board 22 and a base 23. In the circuit board 22, a control circuit that outputs control signals and a drive circuit that supplies drive currents to the electric motor 14 based on the control signal are formed. The base 23 is interposed between the first housing 16 and the second housing 17, and the circuit board 22 is fixed to the base 23. The base 23 is made of a metal material having a high thermal conductivity, such as aluminum alloy, and is formed into a generally rectangular plate-like shape. The circuit board 22 is fixed to an electric motor 14-side portion of the base 23. Further, through-holes 24, 25 through which an output shaft of the electric motor 14 is passed are formed in the circuit board 22 and the base 23, respectively. A module having a connector portion used to connect an external battery to the circuit board 22 is fixed the electric motor 14-side portion of the base 23.

Figure 5:
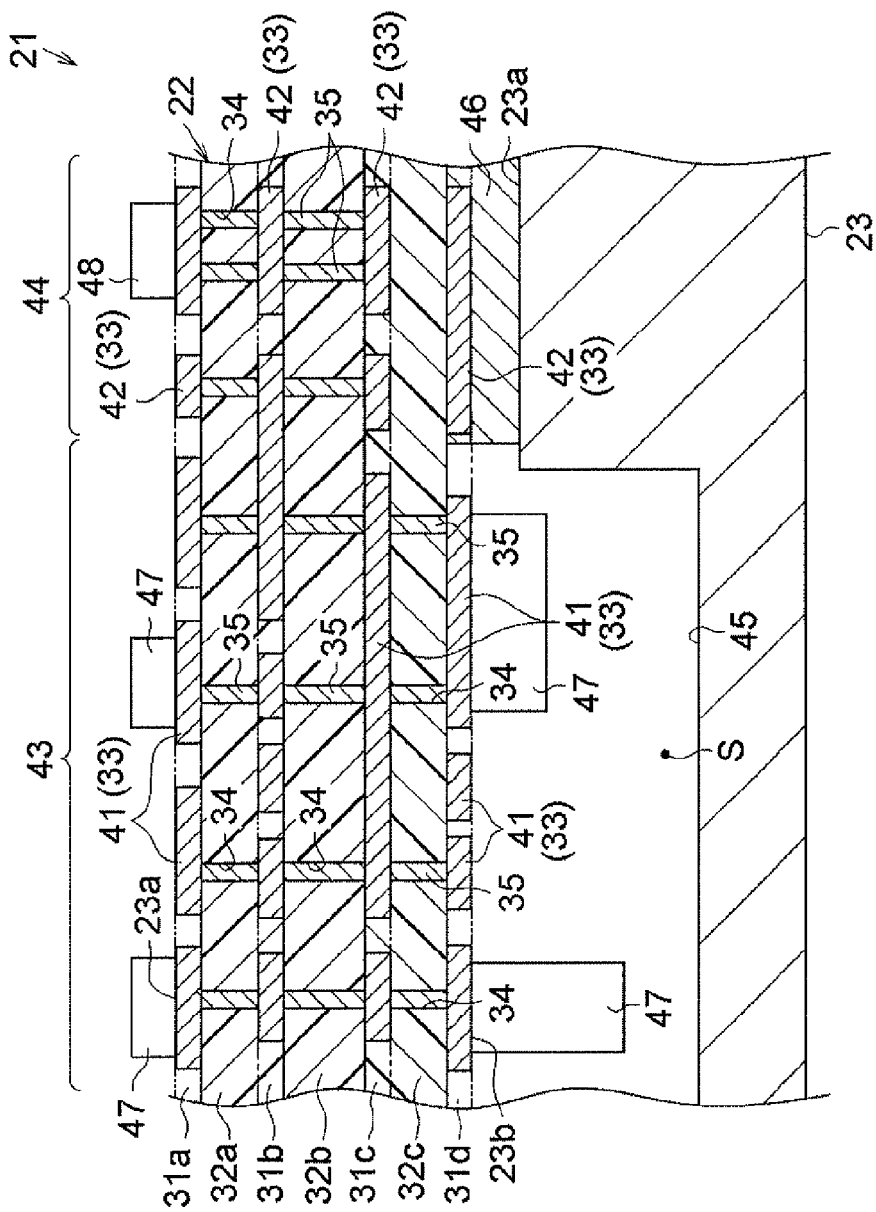
FIG. 5 is a schematic view showing the sectional structure of a circuit board.

Next, the circuit board and its surrounding structures will be described. As shown in FIG. 5, the circuit board 22 has a multilayer structure in which first to fourth circuit conductive layers 31a to 31d are laminated with first to third non-conductive layers 32a to 32c interposed therebetween. More specifically, the circuit board 22 is configured such that the first circuit conductive layer 31a, the first non-conductive layer 32a, the second circuit conductive layer 31b, the second non-conductive layer 32b, the third circuit conductive layer 31c, the third non-conductive layer 32c, and the fourth circuit conductive layer 31d are laminated in order from the side opposite to the base 23.

The first to fourth circuit conductive layers 31a to 31d each have a predetermined circuit pattern 33 formed by removing part of a conductive foil such as a copper foil, and clearances between wirings that constitute the circuit patterns 33 of the second and third circuit conductive layers 31b, 31c are filled with a non-conductive resin material. On the other hand, the first to third non-conductive layers 32a to 32c are made of a non-conductive resin material to maintain insulation between the circuit patterns 33 located next to each other. Further, in the circuit board 22, via holes (interlayer connection holes) 34 that pass through predetermined circuit conductive layers and non-conductive layers and extend in the laminating direction (up-down direction in FIG. 5) are formed. Further, connecting members 35 made of a conductive material such as copper are fitted in the respective via holes 34, so that the circuit patterns 33 of different layers are electrically connected to each other via the connecting members 35. Thus, the control circuit and the drive circuit are each configured as a three-dimensional circuit. Note that, in the present embodiment, a material having a thermal conductivity higher than that of a resin material, such as ceramic, is added to the third non-conductive layer 32c located closest to the base 23 so as to improve the thermal conductivity of the third non-conductive layer 32c.

The circuit patterns 33 are configured such that control circuit patterns 41 that constitute wirings of the control circuit and drive circuit patterns 42 that constitute wirings of the drive circuit are provided in different regions in the first to fourth circuit conductive layers 31a to 31d such that the control circuit patterns 41 face each other and the drive circuit patterns 42 face each other in the laminating direction. Accordingly, in the circuit board 22, a control pattern portion 43 in which the control circuit patterns 41 are formed and a drive pattern portion 44 in which the drive circuit patterns 42 are formed are provided in different regions. Note that the drive circuit pattern 42 of the fourth circuit conductive layer 31d is insulated from the other circuit patterns 33 including the drive circuit pattern 42 of the third circuit conductive layer 31c.

As shown in FIG. 3 to FIG. 5, a generally square recessed portion 45 is formed in a mounting face 23a of the base 23, to which the circuit board 22 is fixed. In the circuit board 22, the drive pattern portion 44 is fixed to the base 23 via a thermal grease having a high thermal conductivity such that the control pattern portion 43 is placed above the recessed portion 45. As a result, a space S in which circuit elements 47 such as ICs may be placed is formed between the control pattern portion 43 and a bottom face of the recessed portion 45. In the control pattern portion 43 of the circuit board 22, the circuit elements 47 are mounted on both sides of the circuit board 22, i.e., a front face 22a and a rear face 22b of the circuit board 22. Note that in the drive pattern portion 44, a circuit element 48 such as an FET (Field Effect Transistor) is mounted only on the front face 22a. Because the drive circuit pattern 42 of the fourth circuit conductive layer 31d that is in contact with the base 23 is insulated from the other circuit patterns as described above, the insulation between the drive circuit and the base 23 is maintained.

When the circuit board 22 is manufactured, first, a non-conductive resin material is interposed between conductive foils, each of which will be one of the first to fourth circuit conductive layers 31a to 31d, and the conductive foils with the non-conductive material interposed therebetween are formed into a plate-like shape, and part of the conductive foil is removed by, for example, etching. Thus, one of the circuit patterns 33 is formed. Subsequently, another conductive foil is laminated on the circuit pattern 33 with a non-conductive resin material interposed therebetween, and a circuit pattern 33 is formed in this conductive foil. This step is repeatedly performed. Then, the via holes 34 are formed and the connecting members 35 are fitted in the via holes 34. In this way, the circuit board 22 is manufactured.

As described above, according to the present embodiment, it is possible to obtain the following advantageous effects.

(1) By fixing the drive pattern portion 44 to the base 23 such that the insulation between the drive circuit and the base 23 is maintained and the control pattern portion 43 is located above the recessed portion 45, the space S where the circuit elements 47 may be mounted is formed between the control pattern portion 43 and the recessed portion 45. This makes it possible to mount the circuit elements 47 on both sides of a portion of the circuit board 22, in a region where the control pattern portion 43 is provided. As a result, it is possible to obtain the mounting area that is larger than that in a control unit in which circuit elements may be mounted on only one side. This reduces the size of the circuit board 22 to further reduce the size of the control unit 21. This makes it possible to provide the vehicle steering system 1 having, for example, favorable mountability. Further, the drive pattern portion 44 of the circuit board 22 is fixed to the base 23. Therefore, it is possible to release the heat generated in the drive circuit through the base 23, thereby preventing overheating of the drive circuit.

(2) The thermal grease 46 is provided between the base 23 and the drive pattern portion 44. Therefore, it is possible to suppress entry of air into clearances formed by minute unevenness on the rear face 23b of the circuit board 22 and the mounting face 23a of the base 23, and it is possible to effectively transfer the heat generated in the drive circuit to the base 23 to release the heat.

Note that the above-described embodiment may be modified as follows.

In the above-described embodiment, the thermal grease 46 is provided between the drive pattern portion 44 and the base 23. Alternatively, a heat conductive member such as a heat dissipation sheet may be provided between the drive pattern portion 44 and the base 23 as long as the heat conductive member has a high thermal conductivity and it is possible to fill the clearances between the drive pattern portion 44 and the base 23 with the heat conductive member. Further alternatively, a heat conductive member such as the thermal grease 46 need not be provided between the drive pattern portion 44 and the base 23.

In the above-described embodiment, the third non-conductive layer 32c has a high thermal conductivity. Alternatively, all of the first to third non-conductive layers 32a to 32c may have a high thermal conductivity. Further alternatively, the third non-conductive layer 32c need not have a high thermal conductivity.

In the above-described embodiment, the drive circuit pattern 42 of the fourth circuit conductive layer 31d is formed. However, the drive pattern portion 44 may be removed entirely so that the third non-conductive layer 32c is fixed to the base 23 via the thermal grease 46.

Further, the drive circuit pattern 42 of the fourth circuit conductive layer 31d is insulated from the other circuit patterns. However, if it is possible to maintain insulation between the drive circuit and the base 23, the drive circuit pattern 42 of the fourth circuit conductive layer 31d and part of the drive circuit pattern 42 of the third circuit conductive layer 31c may be connected to each other through via holes.

In the above-described embodiment, the number of laminated circuit conductive layers may be changed as needed as long as the number is two or more.

In the above-described embodiment, the invention is applied to the control unit 21 for the electric motor 14 that is used as a driving source for the EPS actuator 13. However, the invention may be applied to a control unit 21 for an electric motor that is used as a driving source for other devices such as an electric pump device.

What is claimed is:

1. A control unit for an electric motor, including a circuit board having a multilayer structure in which multiple circuit conductive layers having circuit patterns are laminated with non-conductive layers interposed between the circuit conductive layers, and a base to which the circuit board is fixed, wherein
   the circuit board has a control pattern portion in which control circuit patterns constituting wirings of a control circuit that outputs a control signal are formed and a drive pattern portion in which drive circuit patterns constituting wirings of a drive circuit that supplies a drive current to the electric motor based on the control signal are formed, the control pattern portion and the drive pattern portion being formed in different regions;
   a recessed portion is formed in the base; and
   the drive pattern portion of the circuit board is fixed to the base via a thermal grease such that electrical insulation between the drive circuit and the base is maintained and the control pattern portion is arranged above the recessed portion; and
   a space in which a circuit element is able to be mounted is formed between the control pattern portion and the recessed portion.

2. A vehicle steering system comprising the control unit for an electric motor according to claim 1.

* * * * *